(12) United States Patent
Kim

(10) Patent No.: US 10,763,138 B2
(45) Date of Patent: Sep. 1, 2020

(54) ADJUSTMENT PLATE AND APPARATUS FOR TREATING SUBSTRATE HAVING THE SAME

(71) Applicant: SEMES CO., LTD., Chungcheongnam-do (KR)

(72) Inventor: Hyung Joon Kim, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 1347 days.

(21) Appl. No.: 13/873,333

(22) Filed: Apr. 30, 2013

(65) Prior Publication Data

US 2013/0284288 A1 Oct. 31, 2013

(30) Foreign Application Priority Data

Apr. 30, 2012 (KR) .................. 10-2012-0045853
Sep. 13, 2012 (KR) .................. 10-2012-0101619

(51) Int. Cl.
*H01L 21/67* (2006.01)
*H01J 37/32* (2006.01)
(Continued)

(52) U.S. Cl.
CPC ...... *H01L 21/6719* (2013.01); *C23C 16/4412* (2013.01); *F16K 3/06* (2013.01);
(Continued)

(58) Field of Classification Search
CPC .. F16K 15/00; F16K 3/06; F16K 51/02; H01J 37/32816; H01J 37/32834;
(Continued)

(56) References Cited

U.S. PATENT DOCUMENTS 4,134,425 A * 1/1979 Gussefeld .............. B01J 8/0278
137/625.3
5,000,225 A * 3/1991 Murdoch .......... H01L 21/67069
118/50
(Continued)

FOREIGN PATENT DOCUMENTS

CN 101523592 A 9/2009
CN 101849279 A 9/2010
(Continued)

*Primary Examiner* — Jeffrie R Lund
(74) *Attorney, Agent, or Firm* — Carter, DeLuca & Farrell LLP

(57) ABSTRACT

Provided is a substrate treating apparatus using a process gas and an adjustment plate used thereof. A substrate treating apparatus including a chamber providing a space in which a process is performed, a support member supporting a substrate in the chamber, a gas supply member supplying a process gas onto the substrate disposed on the support member, and an exhaust assembly coupled to the chamber to exhaust a gas in the chamber, wherein the exhaust assembly includes an exhaust pipe connected to the chamber, an exhaust member connected to the exhaust pipe to provide a vacuum pressure in the exhaust pipe, a valve adjusting an opening rate of the exhaust pipe, and an adjustment plate having a cover plate which is provided in the chamber to interfere with a flow of the process gas in an internal region of the chamber in a direction corresponding to, when the exhaust pipe is partially opened, an opened region of the exhaust pipe. Consequently, the process gas may be uniformly supplied onto the substrate.

16 Claims, 11 Drawing Sheets

(51) Int. Cl.
*F16K 3/06* (2006.01)
*F16K 51/02* (2006.01)
*C23C 16/44* (2006.01)

(52) U.S. Cl.
CPC ........ *F16K 51/02* (2013.01); *H01J 37/32633* (2013.01); *H01J 37/32816* (2013.01); *H01J 37/32834* (2013.01); *H01L 21/67017* (2013.01); *Y10T 137/7897* (2015.04)

(58) Field of Classification Search
CPC ......... H01J 37/32633; H01L 21/67017; H01L 21/6719; Y10T 137/7897
See application file for complete search history.

(56) References Cited

U.S. PATENT DOCUMENTS

| | | | | |
|---|---|---|---|---|
| 5,441,568 | A * | 8/1995 | Cho | C23C 16/4412 118/715 |
| 5,605,637 | A * | 2/1997 | Shan | H01J 37/32477 118/723 E |
| 5,891,350 | A * | 4/1999 | Shan | H01J 37/32477 118/723 E |
| 5,919,332 | A * | 7/1999 | Koshiishi | C23C 16/5096 118/723 E |
| 5,997,589 | A * | 12/1999 | Tien | C23C 16/4412 29/25.01 |
| 6,051,100 | A * | 4/2000 | Walko, II | H01J 37/32834 118/723 E |
| 6,120,605 | A * | 9/2000 | Sato | C23C 16/4401 118/715 |
| 6,156,151 | A * | 12/2000 | Komino | H01J 37/3244 156/345.29 |
| 6,176,969 | B1 * | 1/2001 | Park | H01J 37/3244 156/345.29 |
| 6,178,919 | B1 * | 1/2001 | Li | H01J 37/32165 118/723 E |
| 6,206,976 | B1 * | 3/2001 | Crevasse | C23C 16/45521 118/500 |
| 6,221,202 | B1 * | 4/2001 | Walko, II | H01J 37/32623 118/723 E |
| 6,408,786 | B1 * | 6/2002 | Kennedy | C23C 16/4404 118/723 AN |
| 6,726,801 | B2 * | 4/2004 | Ahn | H01J 37/32633 156/345.29 |
| 6,733,620 | B1 * | 5/2004 | Sugiyama | H01J 37/32633 156/345.29 |
| 6,878,234 | B2 * | 4/2005 | Ogasawara | H01J 37/3244 118/715 |
| 6,963,043 | B2 * | 11/2005 | Fink | H01J 37/32642 118/723 R |
| 7,166,166 | B2 * | 1/2007 | Saigusa | H01J 37/32431 118/715 |
| 7,198,677 | B2 * | 4/2007 | Yoo | C23C 16/0236 118/715 |
| 7,311,784 | B2 * | 12/2007 | Fink | H01J 37/32642 118/723 E |
| 7,648,610 | B2 * | 1/2010 | Komiya | C23C 16/4412 118/715 |
| 7,749,326 | B2 * | 7/2010 | Kim | C23C 16/45508 118/715 |
| 7,987,814 | B2 * | 8/2011 | Carducci | H01J 37/32082 118/723 R |
| 8,075,728 | B2 * | 12/2011 | Balakrishna | H01J 37/32449 118/715 |
| 8,118,938 | B2 * | 2/2012 | Carducci | H01J 37/32082 118/715 |
| 8,152,925 | B2 * | 4/2012 | Iizuka | H01J 37/3244 118/715 |
| 8,277,561 | B2 * | 10/2012 | Kim | C23C 16/45508 118/715 |
| 8,298,338 | B2 * | 10/2012 | Kim | C23C 16/4412 118/715 |
| 8,597,462 | B2 * | 12/2013 | Brown | H01J 37/32495 156/345.37 |
| 8,608,851 | B2 * | 12/2013 | Ni | C23C 16/4404 118/715 |
| 2002/0038791 | A1 * | 4/2002 | Okumura | C23C 16/4412 216/71 |
| 2002/0134308 | A1 * | 9/2002 | Amano | H01L 21/67017 118/715 |
| 2003/0038111 | A1 * | 2/2003 | Carducci | H01L 21/68792 216/59 |
| 2004/0040940 | A1 * | 3/2004 | Fink | H01J 37/32642 219/121.43 |
| 2004/0129218 | A1 * | 7/2004 | Takahashi | H01J 37/32834 118/715 |
| 2004/0261712 | A1 * | 12/2004 | Hayashi | H01L 21/67069 118/723 E |
| 2005/0103440 | A1 * | 5/2005 | Sato | H01J 37/32623 156/345.29 |
| 2005/0167052 | A1 * | 8/2005 | Ishihara | H01J 37/32834 156/345.47 |
| 2005/0224180 | A1 * | 10/2005 | Bera | C23C 16/4412 156/345.33 |
| 2006/0151114 | A1 * | 7/2006 | Fink | H01J 37/3244 156/345.29 |
| 2007/0000614 | A1 * | 1/2007 | Hatamura | H01J 37/32642 156/345.51 |
| 2008/0035605 | A1 * | 2/2008 | Takahashi | H01J 37/32844 216/58 |
| 2009/0188625 | A1 * | 7/2009 | Carducci | H01J 37/32623 156/345.34 |
| 2009/0218043 | A1 * | 9/2009 | Balakrishna | H01J 37/32449 156/345.33 |
| 2009/0314432 | A1 * | 12/2009 | Iizuka | H01J 37/3244 156/345.27 |
| 2010/0006543 | A1 * | 1/2010 | Sawada | H01J 37/32082 216/67 |
| 2010/0204810 | A1 * | 8/2010 | Saito | H01J 37/32522 700/90 |
| 2010/0206231 | A1 * | 8/2010 | Yoon | H01J 37/32357 118/723 I |
| 2012/0000886 | A1 * | 1/2012 | Honda | H01J 37/18 216/24 |
| 2013/0284288 | A1 * | 10/2013 | Kim | H01L 21/6719 137/526 |
| 2014/0034240 | A1 * | 2/2014 | Kim | H01L 21/02 156/345.33 |
| 2014/0319121 | A1 * | 10/2014 | Kim | H01L 21/67109 219/444.1 |

FOREIGN PATENT DOCUMENTS

| | | |
|---|---|---|
| CN | 102420089 A | 4/2012 |
| KR | 10-2003-27505 A | 4/2003 |
| KR | 10-0665991 A | 5/2006 |
| KR | 10-0927375 A | 3/2009 |
| KR | 10-2010-8828 A | 1/2010 |
| KR | 2010-0138687 A | 12/2010 |

* cited by examiner

ADJUSTMENT PLATE AND APPARATUS FOR TREATING SUBSTRATE HAVING THE SAME

CROSS-REFERENCE TO RELATED APPLICATIONS

This U.S. non-provisional patent application claims priority under 35 U.S.C. § 119 of Korean Patent Application Nos. 10-2012-0045853, filed on Apr. 30, 2012, and 10-2012-0101619, filed on Sep. 13, 2012, the entire contents of which are hereby incorporated by reference.

BACKGROUND OF THE INVENTION

The present invention disclosed herein relates to an apparatus for treating a substrate, and more particularly, to a substrate treating apparatus using a process gas and an adjustment plate used therefor.

A semiconductor device manufacturing process includes various operations, such as etching, deposition, and cleaning, and so on. Among these operations, the etching and deposition operations are performed while supplying a process gas in a chamber, and at this time, the process gas should be uniformly supplied onto an entire region of a substrate for process uniformity.

In these operations, the process gas is supplied into the chamber, and also, an internal pressure of the chamber is constantly maintained. A vacuum pressure is provided to the chamber for constantly maintaining the internal pressure of the chamber. The vacuum pressure is supplied through an exhaust pipe that is connected to a bottom surface of the chamber. In this regard, the vacuum pressure and an exhaust amount of the process gas according to the vacuum pressure may be adjusted by an opening rate of the exhaust pipe. FIG. 1 is a cross-sectional view of a general substrate treating apparatus, and FIG. 2 is a cross-sectional view illustrating the air current flow in a chamber when a portion of the exhaust pipe in FIG. 1 is opened. Referring to FIGS. 1 and 2, a valve 20 is installed on an exhaust pipe 10. The valve 20 has a structure that a cover plate 22 rotatably moves about a hinge shaft 24 to adjust the opening rate of the exhaust pipe 10. The cover plate 22 may rotatably move on a plane perpendicular to a length direction of the exhaust pipe 10.

However, an opening region of the exhaust pipe 10 is asymmetrically provided. As a result, airflow is formed in a direction in which an exhaust flow of a process gas is directed toward the opening region in the chamber. Asymmetric airflow generated in the chamber concentrates the process gas on a specific region such as region 'A' of FIG. 2. As a result, the process gas is non-uniformly supplied onto a substrate.

Patent Document

Korean Patent Application Laid-open Publication No. 2010-0138687

SUMMARY OF THE INVENTION

The present invention provides a substrate treating apparatus uniformly supplying a process gas onto a substrate and method thereof.

Embodiments of the present invention provide substrate treating apparatuses and adjustment plates used therefor. The substrate treating apparatus include: a chamber providing a space in which a process is performed; a support member supporting a substrate in the chamber; a gas supply member supplying a process gas onto the substrate disposed on the support member; and an exhaust assembly coupled to the chamber to exhaust a gas in the chamber, wherein the exhaust assembly includes: an exhaust pipe connected to the chamber; an exhaust member connected to the exhaust pipe to provide a vacuum pressure to the exhaust pipe; a valve adjusting an opening rate of the exhaust pipe; and an adjustment plate having a cover plate which is provided in the chamber to interfere with a flow of the process gas in an internal region of the chamber in a direction corresponding to, when the exhaust pipe is partially opened, an opened region of the exhaust pipe.

In some embodiments, the cover plate may have an arc shape surrounding a portion of the support member. In other embodiments, the adjustment plate may further include: an outer ring coupled to contact an inner wall of the chamber; and an inner ring coupled to contact an outer surface of the support member, wherein the cover plate is coupled between the outer ring and the inner ring. In still other embodiments, the cover plate may have a plurality of holes, and the holes may be respectively inclined in up and down directions. In even other embodiments, the holes may be respectively provided in the form of slits. In yet other embodiments, the slit may have an arc shape. In further embodiments, the holes may be upwardly inclined toward a direction away from the support member. In still further embodiments, some of the holes may be inclined so that a lower region of the cover plate may not be seen when viewed from an upper side. In even further embodiments, another some of the holes may be inclined so that a lower region of the cover plate may be seen when viewed from an upper side. In yet further embodiments, the some of holes may be disposed adjacent to an outer side of the cover plate, and the another some of holes may be disposed adjacent to an inner side of the cover plate.

In much further embodiments, the cover plate may have a plurality of holes having different sizes along a direction away from the support member. In still much further embodiments, the cover plate may have the plurality of holes, and the holes disposed adjacent to the inner side of the cover plate may have a width greater than the holes disposed adjacent to the outer side of the adjustment plate.

In even much further embodiments, the exhaust assembly may have a circular ring shape surrounding the support member, the exhaust assembly may have a plurality of through holes, and the exhaust assembly may further include a baffle disposed on the adjustment plate. In yet much further embodiments, the exhaust pipe may be disposed on a bottom center of the chamber. In even still much further embodiments, the valve may include a control plate moved on a plane perpendicular to a length direction of the exhaust pipe.

In other embodiments of the present invention, an adjustment plate is disposed within a chamber to adjust an exhaust amount in each region in the chamber. The adjustment plate includes: an outer ring; an inner ring disposed on an inside of the outer ring; and a cover plate disposed on a portion of a region between the outer ring and the inner ring, and having a plurality of holes.

In some embodiments, the cover plate may have an arc shape. In other embodiments, the holes may be respectively inclined in up and down directions. In still other embodiments, some of the holes may be inclined so that a lower region of the cover plate may not be seen when viewed from an upper side.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
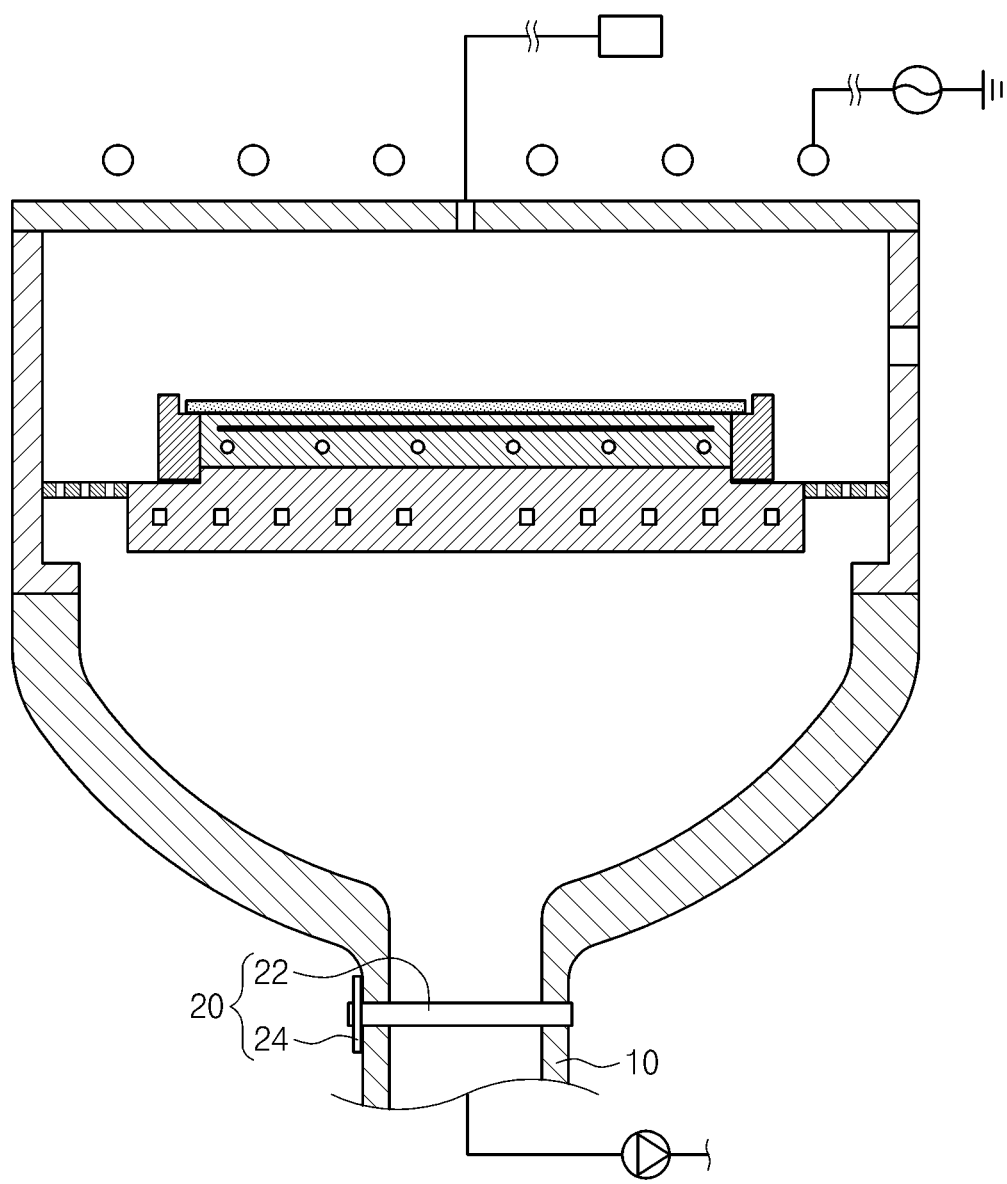
FIG. 1 is a cross-sectional view of a general substrate treating apparatus.
Figure 2:
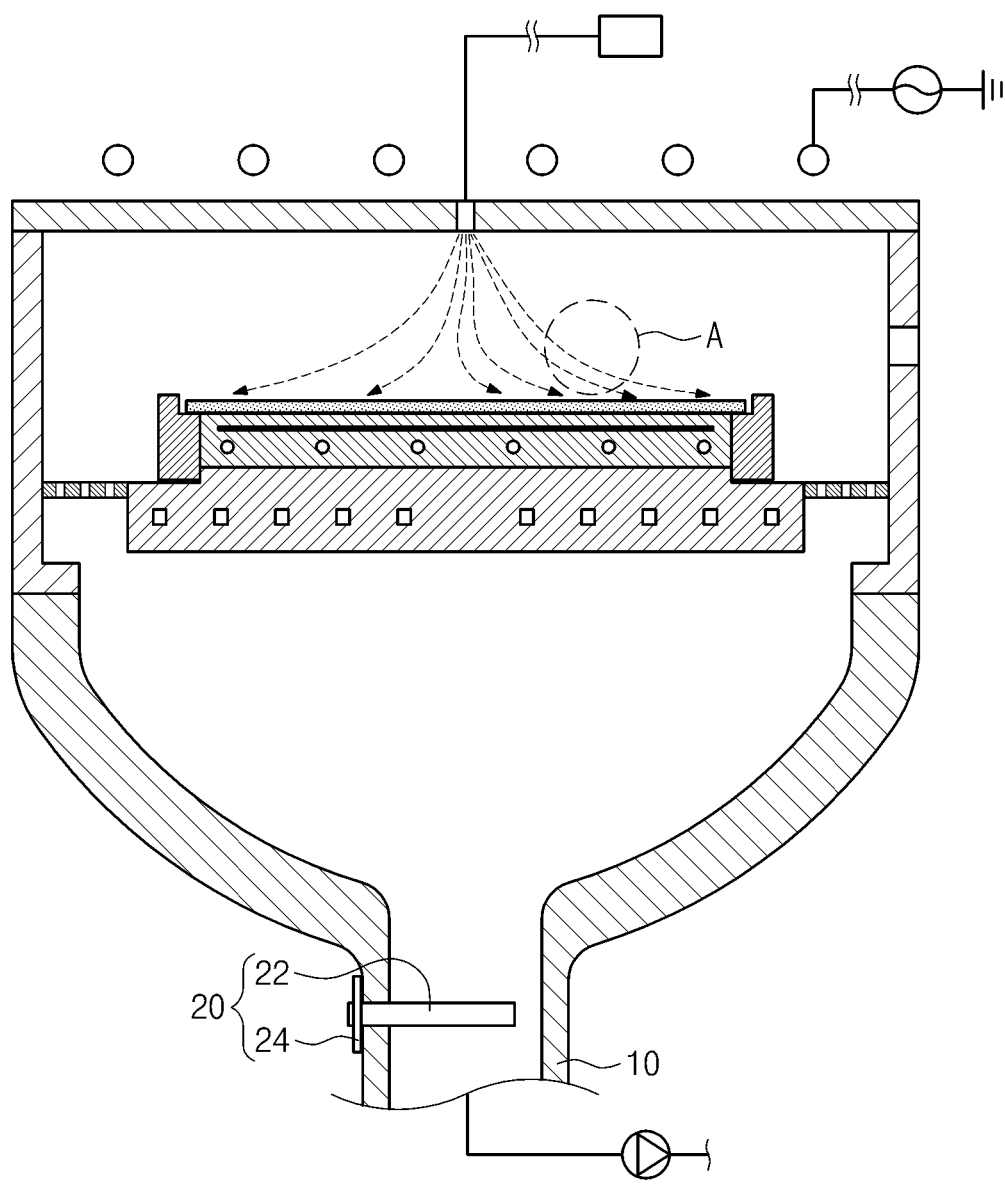
FIG. 2 is a cross-sectional view illustrating an airflow according to an opening rate of the exhaust pipe of FIG. 1.

The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Thus, the shape of elements in the drawings may be exaggerated for clarity.

A substrate treating apparatus etching a substrate using a process gas according to an embodiment of the present invention will be described. However, the present invention is not limited thereto. For example, the present invention may be applied to various apparatuses which may perform a process while supplying a process gas into a chamber.

Figure 3:
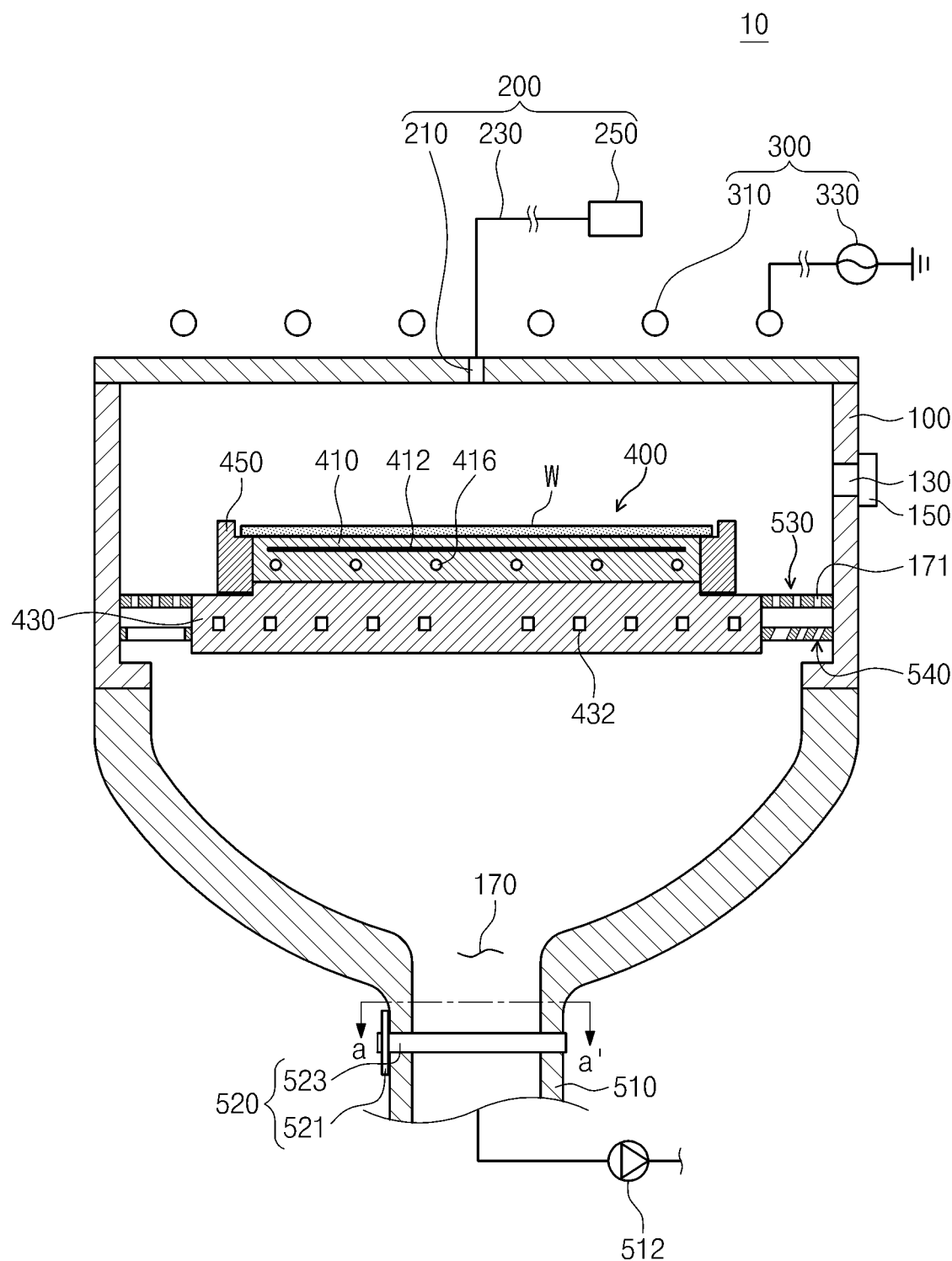
FIG. 3 is a cross-sectional view of a substrate treating apparatus according to an embodiment of the present invention.

FIG. 3 is a cross-sectional view of a substrate treating apparatus according to an embodiment of the present invention. Referring to FIG. 3, a substrate treating apparatus 10 includes a chamber 100, a gas supply member 200, a plasma source 300, a support member 400, and an exhaust assembly 500.

The chamber 100 provides a space in which a process is performed. The chamber 100 has a cylindrical shape. The chamber 100 is formed of a metal. For example, the chamber 100 may be formed of an aluminum material. An exhaust hole 170 is defined in the bottom of the chamber 100. A byproduct generated during the process and a process gas which stays within the chamber 100 are discharged to the outside through an exhausting hole 170. An opening 130 is defined on a side surface of the chamber 100. The opening 130 functions as a passage through which a substrate W is loaded and unloaded. A door 150 is disposed on the opening 130 to open and close the opening 130.

The gas supply member 200 supplies a process gas into the chamber 100. The gas supply member 200 includes a gas storage part 250, and a gas supply line 230, and a gas inflow port 210. The gas supply line 230 connects the gas storage part 250 and the gas inflow port 210. A process gas stored in the gas storage part 250 is supplied into the gas inflow port 210 through the gas supply line 230. A valve is installed on the gas supply line 230 to open and close a passage or adjusts a flow rate of the process gas that flows through the passage.

A plasma source 300 excites the process gas to a plasma state in the chamber 100. An inductively coupled plasma (ICP) source may be used for the plasma source 300. The plasma source 300 includes an antenna 310 and an outer power source 330. The antenna 310 is disposed on an outer upper portion of the chamber 100. The antenna 310 is provided in the form of a spiral coil wound a plurality of times, and connected to the outer power source 330. The antenna 310 receives electric power from the outer power source 330. When the electric power is applied to the antenna 310, the antenna 310 may form an electromagnetic field within the chamber 100. The process gas is excited to the plasma state by the electromagnetic field.

A support member 400 supports a substrate (W) within the chamber 100. The support member 400 is provided as an electrostatic chuck 400 supporting the substrate (W) by using an electrostatic force. The support member 400 may selectively support the substrate (W) in various methods such as a mechanical clamping.

The electrostatic chuck 400 includes a dielectric plate 410, a focus ring 450, and a base 430.

The substrate W is placed on the top surface of the dielectric plate 410. The dielectric plate 410 has a disk shape. The dielectric plate 410 may have a diameter less than the substrate (W). A lower electrode 412 is disposed in the dielectric plate 410. The lower electrode 412 is connected to a power source, and receives electric power from the power source. The lower electrode 412 provides an electrostatic force to adsorb the substrate (W) onto the dielectric plate 410 from the applied electric power. A heater 416 heating the substrate (W) is installed in the dielectric plate 410. The heater 416 may be disposed under the lower electrode 412. The heater 416 may be provided in the form of a spiral heating wire.

The focus ring 450 concentrates plasma on the substrate (W). The focus ring 450 may be provided to surround a circumference of the dielectric plate 410. The focus ring 450 has a circular ring shape. The focus ring 450 has a stepped surface with an outer portion higher than an inner portion. A top surface of the inner portion of the focus ring 450 supports an edge portion of a bottom surface of the substrate (W). The outer portion of the focus ring 450 may surround a side portion of the substrate (W).

The base 430 supports the dielectric plate 410. The base 430 is disposed under the dielectric plate 410, and fixedly coupled to the dielectric plate 410. A top surface of the base 430 has a stepped surface with a central region of the base being higher than an edge region of the base. A central region of the top surface of the base 430 has an area corresponding to a bottom surface of the dielectric plate 410. A cooling passage 432 is disposed in the base 430. The cooling passage 432 is provided as a passage through which cooling fluid circulates. The cooling passage 432 is provided in a spiral shape within the base 430.

The exhaust assembly 500 exhausts the process gas that stays in the chamber 100 to the outside. The exhaust assembly 500 includes an exhaust pipe 510, an exhaust member 512, a valve 520, a baffle 530, and an adjustment plate 540.

Figure 4:
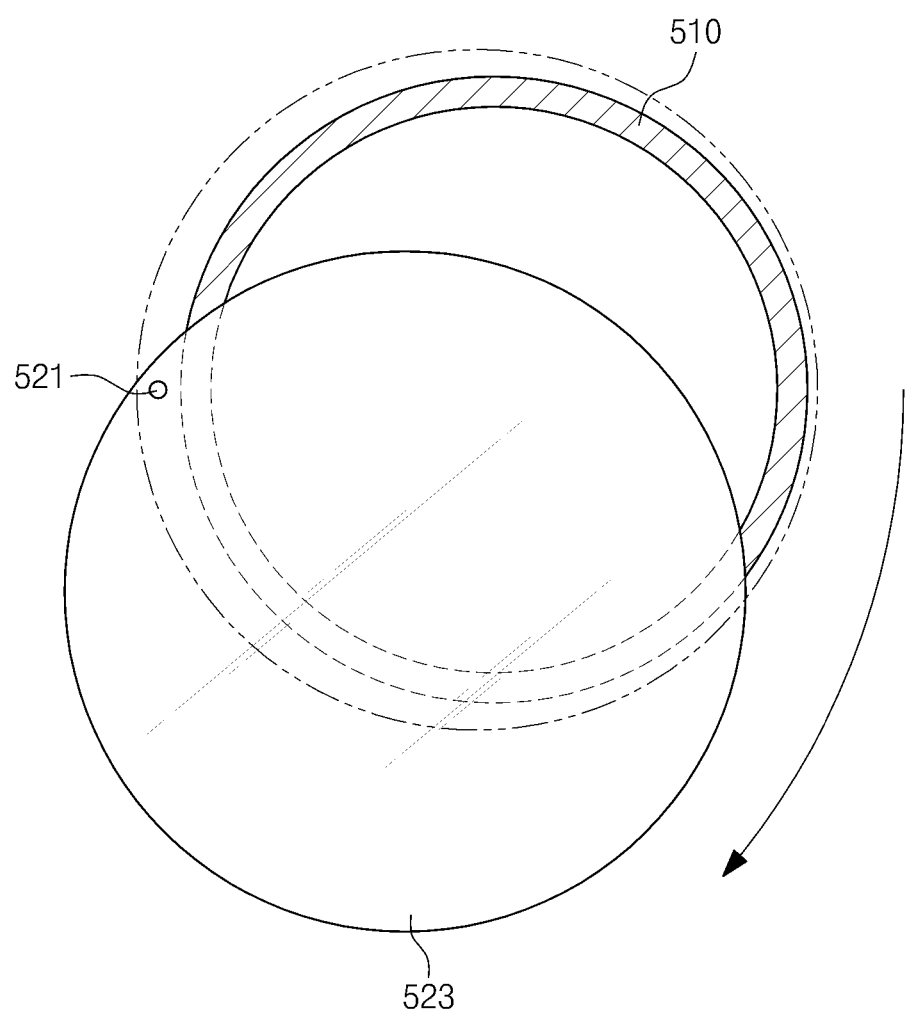
FIG. 4 is a cross-sectional view taken along line a-a' of FIG. 3.

FIG. 4 is a cross-sectional view of the exhaust pipe taken along line a-a' of FIG. 3. Referring to FIG. 4, the exhaust pipe 510 is connected to a bottom surface of the chamber 100 to communicate with the exhausting hole 170 of the chamber 100. The exhaust member 512 is installed in the exhaust pipe 510. The exhaust member 512 provides a vacuum pressure to the chamber 100. For example, the exhaust member 512 may be a pump.

Figure 5:
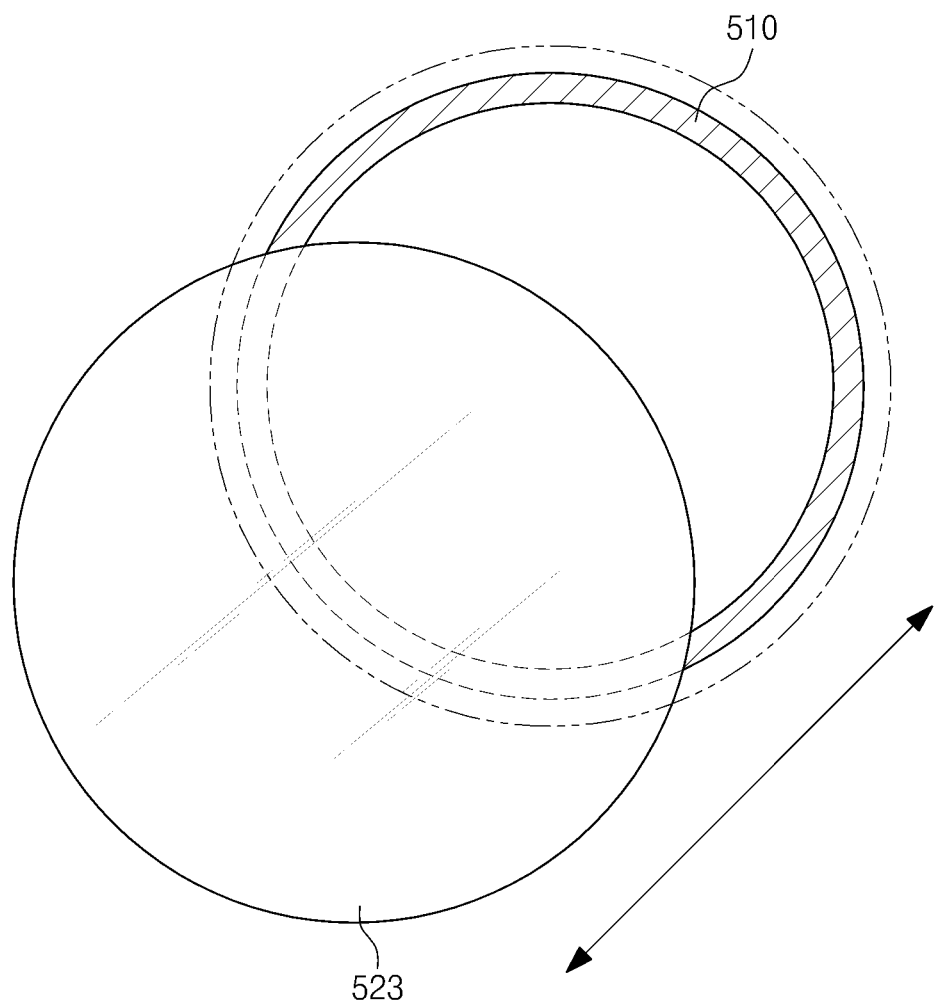
FIG. 5 is a cross-sectional view of another embodiment of the valve of FIG. 4.

The valve 520 adjusts the opening rate of the exhaust pipe 510. The valve 520 is installed between the chamber 100 and the exhaust member 512 in the exhaust pipe 510. The valve 520 has a control plate 523 to control a passage area of the exhaust pipe 510. The control plate 523 has an area corresponding to a passage area of the exhaust pipe 510 or greater than the passage area of the exhaust pipe 510. A hinge shaft 521 is coupled to the control plate 523. The control plate 523 is rotatably provided about the hinge shaft 521 acting as a rotation center. The hinge shaft 521 is parallel to the exhaust pipe 510 in a longitudinal direction thereof. Thus, the control plate 523 is rotatably moved on a plane perpendicular to a length direction of the exhaust pipe 510. The opening rate of the exhaust pipe 510 may be adjusted according to rotation of the control plate 523. As shown in FIG. 5, the control plate 523 may selectively adjust the opening rate of the exhaust pipe 510 by linearly moving in a direction on a plane perpendicular to a length direction of the exhaust pipe 510. When the exhaust pipe 510 is partially opened, an airflow is densely formed toward a direction corresponding to an open region of the exhaust pipe 510 within the chamber 100. Herein, an internal region of the chamber 100 in a direction corresponding to the open region of the exhaust pipe 510 is called a high density gas region.

Figure 6:
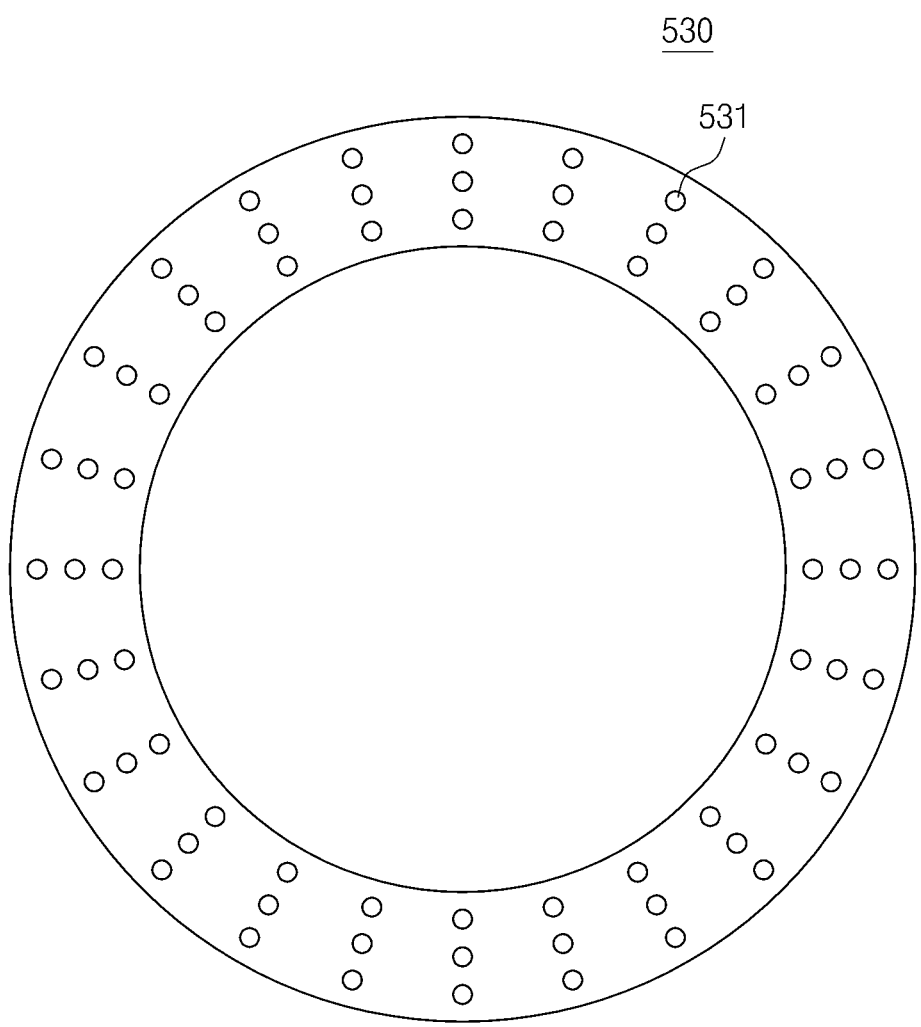
FIG. 6 is a plan view of the baffle of FIG. 3.

FIG. 6 is a plan view of the baffle of FIG. 3. Referring to FIG. 6, the baffle 530 is provided within the chamber 100. The baffle 530 has a circular ring shape. The baffle 530 is disposed between an inner wall of the chamber 100 and the support member 400. The baffle 530 has a plurality of through holes 531 therein. In the chamber 100, the process gas passes through the through holes 531 of the baffle 530 and exhausts through the exhausting hole 170. The exhausting hole 170 is substantially uniformly disposed in an entire region of the baffle 530.

The adjustment plate 540 is adjusted such that a vacuum pressure uniformly acts on an entire internal region of the chamber 100. The adjustment plate 540 is disposed under the baffle 530. The adjustment plate 540 is disposed between an inner wall of the chamber 100 and the support member 400.

Figure 7:
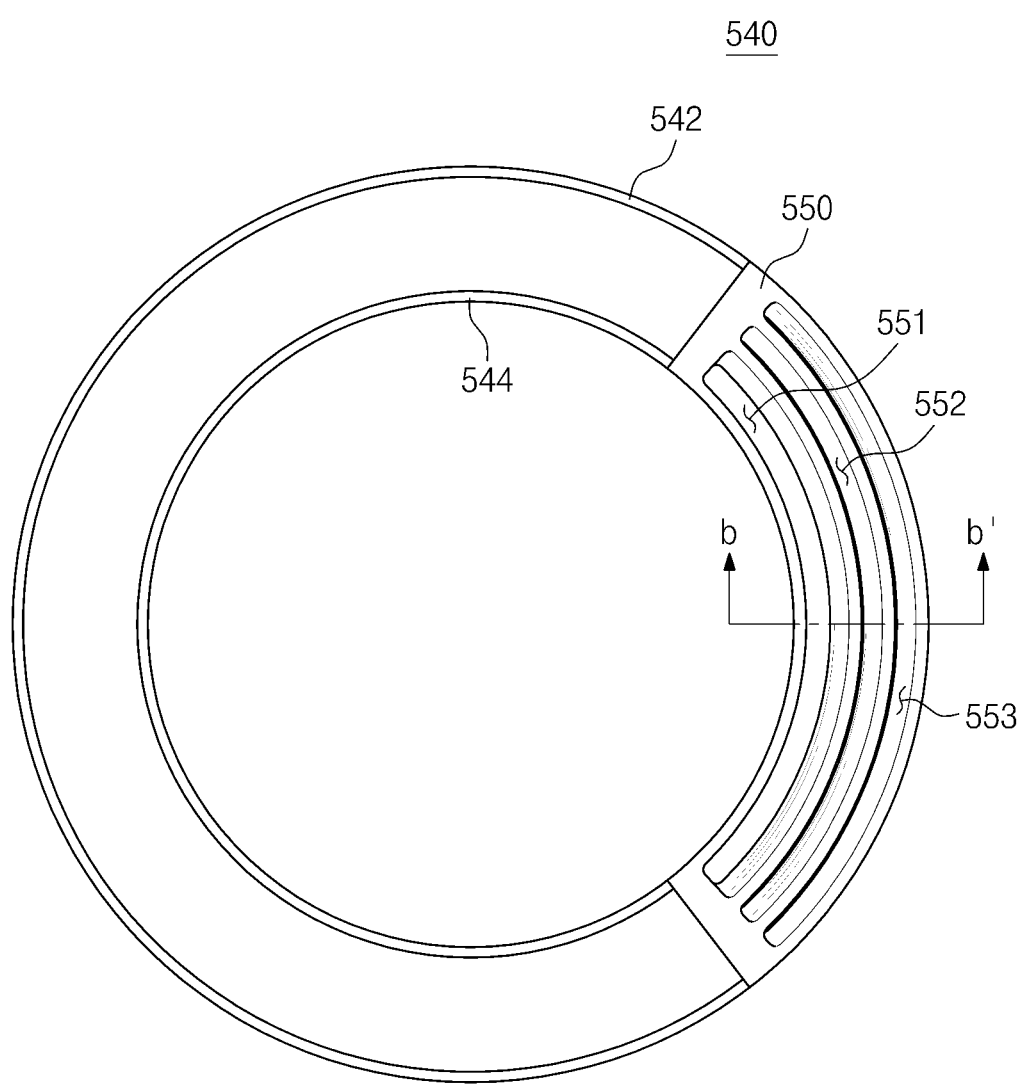
FIG. 7 is a plan view of an adjustment plate of FIG. 3.
Figure 8:
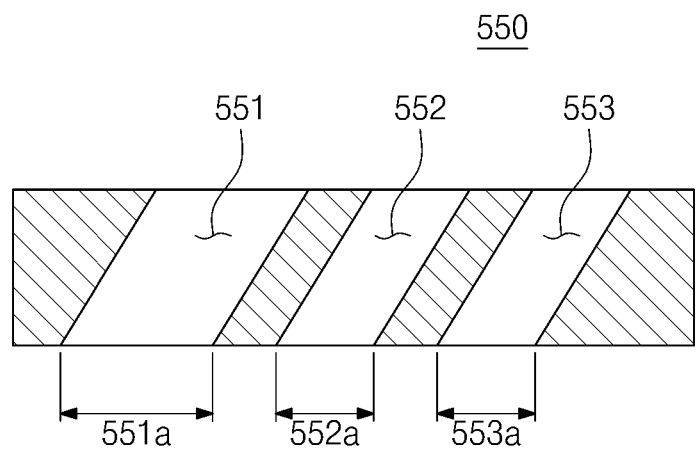
FIG. 8 is a cross-sectional view of the adjustment plate taken along line b-b' of FIG. 7.

FIG. 7 is a plan view of the adjustment plate of FIG. 3, and FIG. 8 is a cross-sectional view of the adjustment plate taken along line b-b' of FIG. 7. Referring to FIGS. 7 and 8, the adjustment plate 540 includes an outer ring 542, an inner ring 544, and a cover plate 550. The outer ring 542 has a circular ring shape. The outer ring 542 has a width corresponding to the inner wall of the chamber 100. The outer ring 542 may be in contact with the inner wall of the chamber 100. The inner ring 544 is disposed inside the outer ring 542. The inner ring 544 has a width corresponding to an outer surface of the support member 400. The inner ring 544 may be in contact with the outer surface of the support member 400.

The cover plate 550 is disposed between the outer ring 542 and the inner ring 544. The cover plate 550 is disposed on the high density gas region of the chamber 100. The cover plate 550 may have an arc shape. An inner surface of the cover plate 550 is coupled to the inner ring 544, and an outer surface of the cover plate 550 is coupled to the outer ring 542. The cover plate 550 has a first hole 551, a second hole 552, and a third hole 553. The first hole 551, the second hole 552, and the third hole 553 are sequentially arranged along the direction away from the support member 400. The first hole 551, the second hole 552, and the third hole 553 are respectively provided in the form of slits 551, 552, and 553. Each of the slits 551, 552, and 553 may have an arc shape. Each of the holes 551, 552, and 553 is inclined in an up and down direction. In an embodiment, each of the holes 551, 552, and 553 may be upwardly inclined toward a direction away from the support member 400. When viewed from an upper side, the first hole 551 may be inclined at an angle in which a lower region of the cover plate 550 is seen. Unlike this, the second hole 552 and the third hole 553 may be inclined at an angle in which the lower region of the cover plate 550 is not seen. Also, the first hole 551, the second hole 552, and the third hole 553 may have different widths from each other. In an embodiment, the width 551a of the first hole 551 may be larger than the width 552a of the second hole 552 and the width 553a of the third hole 553, and the width 552a of the second hole 552 and the width 553a of the third hole 553 may be equal to each other. This is because the amount of plasma exhausted through the first hole 551 may be greater than the amount of plasma exhausted through the second hole 552 or the third hole 553. Consequently, a flow of plasma may be concentrated on the substrate (W).

Also, a flow of the process gas increasingly interferes with the holes 551, 552, and 553 as an inclined angle of each of the holes increases and a width of each of the holes decreases. Consequently, the flow of plasma may be controlled by adjusting the inclined angle and the width of the holes 551, 552, and 553.

Figure 9:
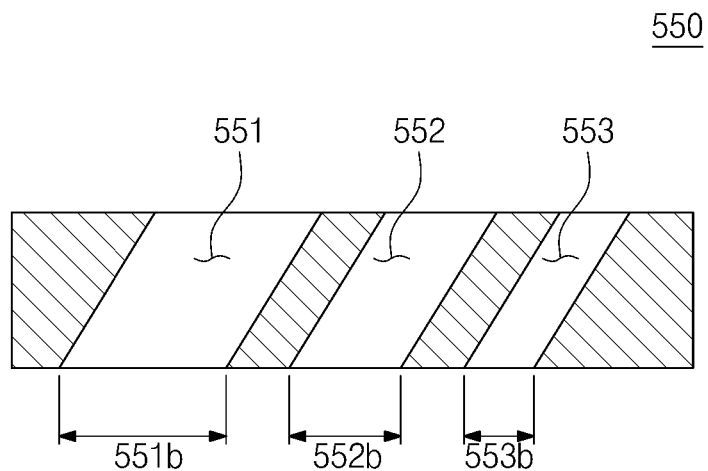
FIG. 9 is a cross-sectional view of another embodiment of the adjustment plate of FIG. 8.
Figure 10:
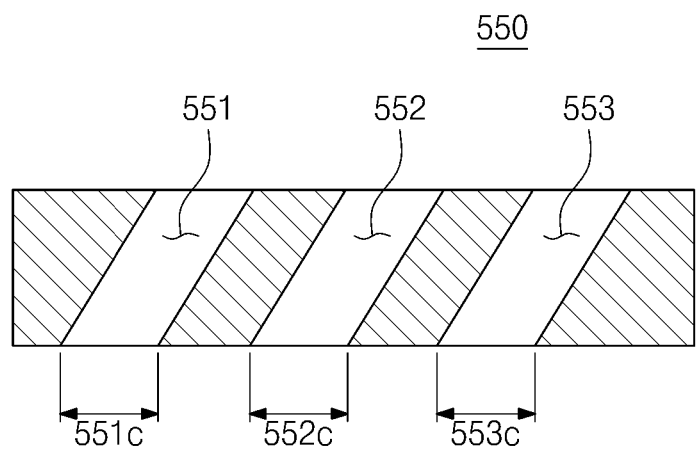
FIG. 10 is a cross-sectional view of another embodiment of the adjustment plate of FIG. 8.

Selectively, a width 551b of the first hole 551, a width 552b of the second hole 552, and a width 553b of the third hole 553 in the adjustment plate 540 may be sequentially decreased in a direction moving away from the support member 400 as shown in FIG. 9.

Selectively, the width 551c of the first hole 551, the width 552c of the second hole 552, and the width 553c of the third hole 553 in the adjustment plate 540 may be equal to one another.

Figure 11:
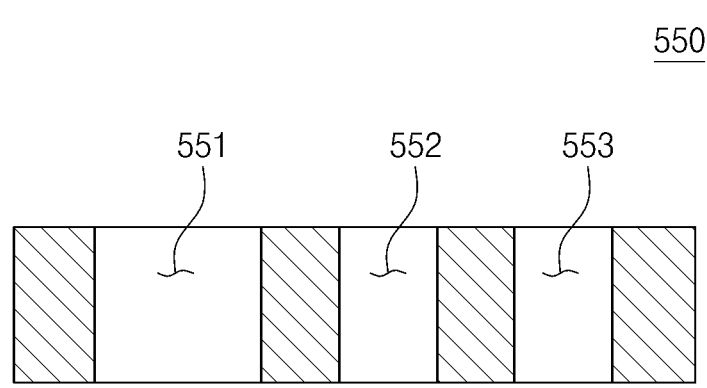
FIG. 11 is a cross-sectional view of another embodiment of the adjustment plate of FIG. 8.
Figure 12:
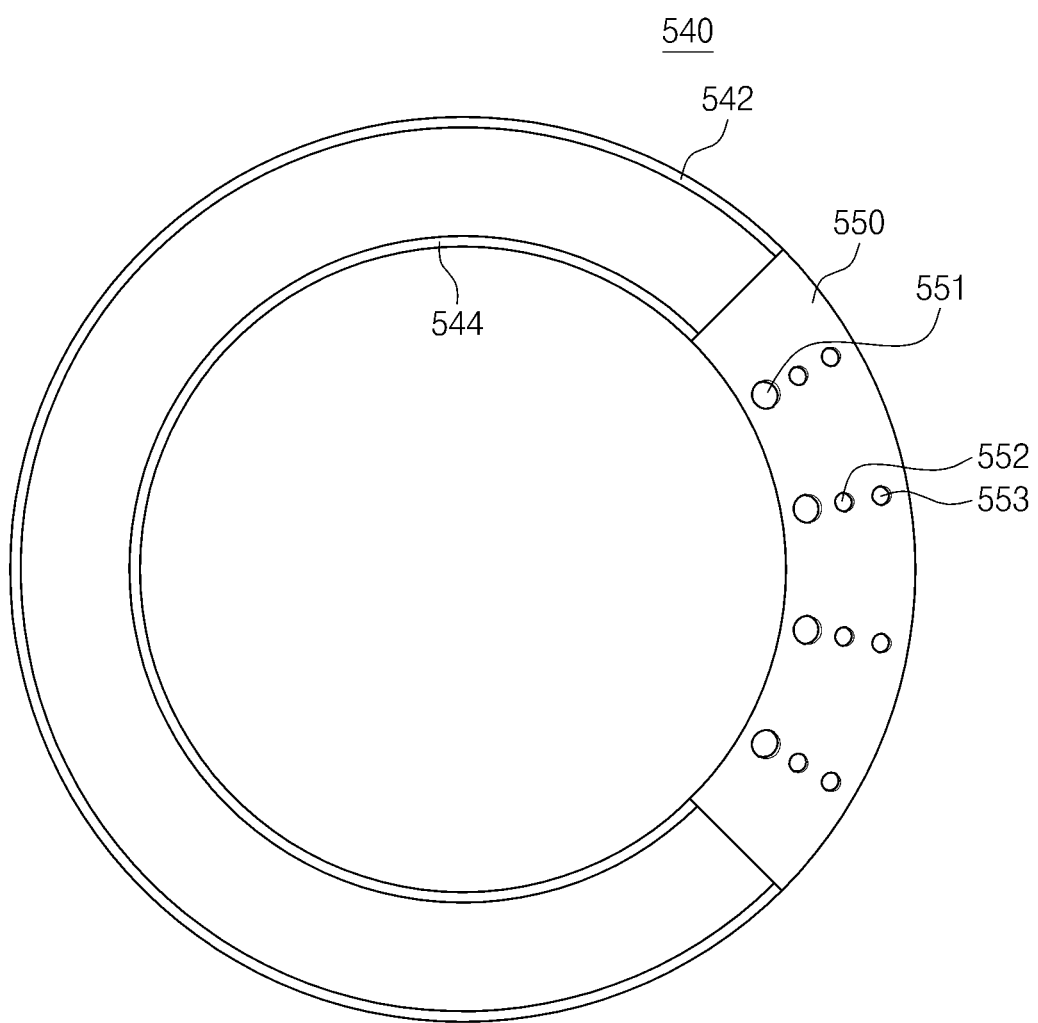
FIG. 12 is a plan view of another embodiment of the adjustment plate of FIG. 3.

Selectively, in the adjustment plate 540, the first hole 551, the second hole 552, and the third hole 553 are arranged in a perpendicular direction to one surface of the adjustment plate 540 as shown in FIG. 11.

Also, the first hole 551, the second hole 552, and the third hole 553 may be provided in the form of slits. However, the first hole 551, the second hole 552, and the third hole 553 may have a circular hole shape.

Figure 13:
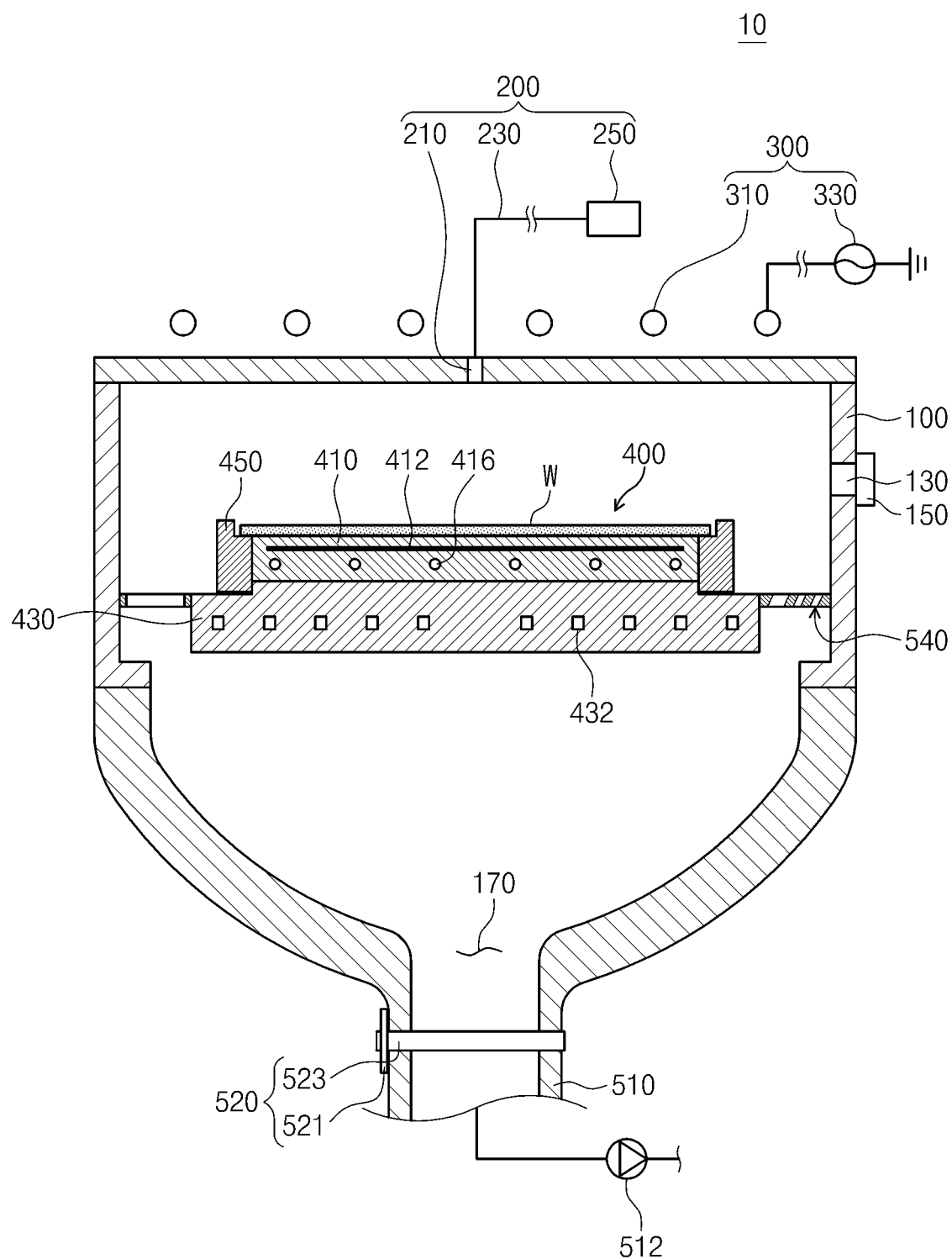
FIG. 13 is a cross-sectional view of a substrate treating apparatus according to another embodiment of FIG. 3.

Also, as shown in FIG. 13, the substrate treating apparatus according to the present invention may be provided with only the adjustment plate 540 without the baffle 530.

According to embodiments above-described, the adjustment plate 540 interferes with the flow of the process gas in a concentration region of the chamber 100. Consequently, the adjustment plate 540 disperses an airflow of the process gas that is formed in the concentration region of the chamber 100 to allow the process gas to be uniformly exhausted with respect to the entire region of the chamber 100.

Also, the plasma source 300 may include capacitively coupled plasma (CCP). The capacitively coupled plasma (CCP) may include a first electrode and a second electrode that are disposed within the chamber 100. The first electrode and the second electrode are respectively disposed on a top surface and a surface in the chamber 100, and the electrodes may be disposed parallel to each other in an up and down direction. One of the electrodes may be applied with a high frequency power, and the other electrode may be grounded. An electromagnetic field is formed in a space between the both electrodes, and the process gas supplied into the space may be excited to a plasma state.

According to the embodiments of the present invention, the process gas may be uniformly supplied onto the substrate.

The above-disclosed subject matter is to be considered illustrative, and not restrictive, and the appended claims are intended to cover all such modifications, enhancements, and other embodiments, which fall within the true spirit and scope of the present invention. Accordingly, the embodiments and drawings disclosed in the present disclosure are not intended to limit the technical spirit of the present disclosure, but are illustrative. The scope of the technical spirit of the present disclosure is not limited by the embodiments and drawings, and the scope of the present disclosure should be interpreted based on the following appended claims. Accordingly, all technical spirits falling within an equivalent range should be construed to be included in the scope of the present disclosure.

What is claimed is:

1. A substrate treating apparatus comprising:
    a chamber providing a space in which a process is performed;
    a support member supporting a substrate in the chamber;
    a gas supply member supplying a process gas onto the substrate disposed on the support member; and
    an exhaust assembly coupled to the chamber to exhaust a gas in the chamber,
    wherein the exhaust assembly comprises:
        an exhaust pipe connected to the chamber;
        an exhaust member connected to the exhaust pipe to provide a vacuum pressure in the exhaust pipe;
        a valve adjusting an opening rate of the exhaust pipe; and
        an adjustment plate disposed between an inner wall of the chamber and the support member,
    wherein the adjustment plate includes an outer ring, an inner ring, and a cover plate which is disposed between and coupled to the outer ring and the inner ring and has an arc shape forming an angle with respect to a center of the adjustment plate,
    wherein an opening between the inner ring and the outer ring is open except a portion of the opening covered by the arc shape,
    wherein the exhaust pipe is disposed on a bottom center of the chamber,
    wherein the valve comprises a control plate moved on a plane perpendicular to a length direction of the exhaust pipe to form an opening in the exhaust pipe,
    wherein the space of the chamber is divided into a first region and a second region based on the opening,
    wherein a density of the process gas in the second region is higher than a density of the process gas in the first region,
    wherein the opening which is not covered by the arc shape, corresponds to the first region, and
    wherein the cover plate is disposed in the second region.

2. The substrate treating apparatus according to claim 1, wherein the cover plate has a plurality of holes, and the holes are respectively inclined in up and down directions.

3. The substrate treating apparatus according to claim 2, wherein the holes are respectively provided in slits.

4. The substrate treating apparatus according to claim 3, wherein each of the slits has an arc shape.

5. The substrate treating apparatus according to claim 2, wherein the holes are upwardly inclined toward a direction away from the support member.

6. The substrate treating apparatus according to claim 5, wherein some of the holes are inclined so that a lower region of the cover plate is not seen when viewed from an upper side.

7. The substrate treating apparatus according to claim 6, wherein another some of the holes are inclined so that a lower region of the cover plate is seen when viewed from an upper side.

8. The substrate treating apparatus according to claim 7, wherein the some of the holes are disposed adjacent to an outer side of the cover plate, and the another some of the holes are disposed adjacent to an inner side of the cover plate.

9. The substrate treating apparatus according to claim 1, wherein the cover plate has a plurality of holes having different sizes along a direction away from the support member.

10. The substrate treating apparatus according to claim 9, wherein the holes disposed adjacent to an inner side of the cover plate have a width greater than the holes disposed adjacent to an outer side of the adjustment plate.

11. The substrate treating apparatus according to claim 1, wherein the exhaust assembly has a circular ring shape surrounding the support member, the exhaust assembly has a plurality of through holes, and the exhaust assembly further comprises a baffle disposed over the adjustment plate.

12. The substrate treating apparatus according to claim 1, wherein the exhaust pipe is disposed on a bottom center of the chamber.

13. The substrate treating apparatus according to claim 12, wherein the valve comprises a control plate moved on a plane perpendicular to a length direction of the exhaust pipe.

14. The substrate treating apparatus according to claim 1, wherein an inner surface of the cover plate is coupled to the inner ring and an outer surface of the cover plate is coupled to the outer ring.

15. The substrate treating apparatus according to claim 1, wherein the inner ring is in contact with an outer surface of the support member.

16. The substrate treating apparatus according to claim 1, wherein the outer ring is in contact with an inner wall of the chamber.

* * * * *